(12) United States Patent
van der Mast

(10) Patent No.: US 6,365,896 B1
(45) Date of Patent: Apr. 2, 2002

(54) ENVIRONMENTAL SEM WITH A MAGNETIC FIELD FOR IMPROVED SECONDARY ELECTRON DIRECTION

(75) Inventor: Karel D. van der Mast, Helmond (NL)

(73) Assignee: Philips Electron Optics B.V., Eindhovem (NL)

( * ) Notice: Subject to any disclaimer, the term of this patent is extended or adjusted under 35 U.S.C. 154(b) by 0 days.

(21) Appl. No.: 09/205,526

(22) Filed: Dec. 3, 1998

(30) Foreign Application Priority Data

Dec. 8, 1997 (EP) .............................. 97203838

(51) Int. Cl.$^7$ ..................... H01J 37/244; H01J 37/28
(52) U.S. Cl. ........................ 250/310; 250/397
(58) Field of Search ................. 250/309, 310, 250/397

(56) References Cited

U.S. PATENT DOCUMENTS

| | | | | |
|---|---|---|---|---|
| 3,694,652 A | * | 9/1972 | Banbury et al. ............ | 250/310 |
| 4,596,929 A | * | 6/1986 | Coates et al. ............... | 250/397 |
| 5,412,211 A | * | 5/1995 | Knowles .................... | 250/397 |
| 5,578,822 A | * | 11/1996 | Van Der Mast et al. .... | 250/310 |
| 5,608,218 A | * | 3/1997 | Sato et al. ................. | 250/310 |
| 5,872,358 A | * | 2/1999 | Tokodoro et al. .......... | 250/310 |

* cited by examiner

Primary Examiner—Bruce Anderson
(74) Attorney, Agent, or Firm—Fulbright & Jaworski L.L.P.

(57) ABSTRACT

The current of secondary electrons emanating from the specimen 14 in an ESEM is amplified by an avalanche-like ionization of the molecules 41 of the gas atmosphere. However, in order to achieve an adequate number of successive ionizations, a comparatively high voltage is required at the detector electrode 30 and, because of the risk of electric breakdowns, the distance between the specimen and the detector may not be smaller than a comparatively large minimum distance. Consequently, the number of successive ionizations is limited and hence also the current amplification. In order to achieve a higher amplification, the invention proposes the application of an additional magnetic field B in the ionization space. The path length of the secondary electrons is thus substantially increased so that a significantly larger number of ionizations takes place and hence a higher amplification is achieved.

26 Claims, 4 Drawing Sheets

ENVIRONMENTAL SEM WITH A MAGNETIC FIELD FOR IMPROVED SECONDARY ELECTRON DIRECTION

The invention relates to a particle-optical apparatus which includes

- a particle source for producing a primary beam of electrically charged particles which travel along an optical axis of the apparatus,
- a specimen holder for a specimen to be examined by means of the apparatus,
- a focusing device for forming a focus of the primary beam in the vicinity of the specimen holder,
- scanning means for scanning the specimen by means of the focused beam,
- detection means for capturing electrically charged particles originating from the specimen.

An apparatus of this kind is known from U.S. Pat. No. 4,785,182.

Apparatus of the kind set forth are known as Scanning Electron Microscopes (SEM). In a SEM a region of a specimen to be examined is scanned by means of a primary beam of electrically charged particles, usually electrons, which travel along an optical axis of the apparatus. The acceleration voltage for the electron beam in the SEM is chosen in dependence on the nature of the specimen to be examined. This acceleration voltage should have a comparatively low value (of the order of magnitude of 1 kV) so as to minimize charging of the specimen by the primary electron beam. This could take place, for example during the study of electrically insulating layers in integrated electronic circuits or for given biological specimens. Moreover, for some examinations it is desirable that the electrons of the primary beam penetrate the specimen to a small depth only, resulting in a better contrast of the image to be formed. Other specimens, however, require a higher acceleration voltage, for example of the order of magnitude of 30 kV.

Irradiation of the specimen to be examined releases electrically charged particles (generally secondary electrons) which have an energy which is substantially lower, for example of the order of magnitude of from 5 to 50 eV. The energy and/or the energy distribution of these secondary electrons offers information as regards the nature and the composition of the specimen. Therefore, an SEM is attractively provided with a detector for secondary electrons. These electrons are released at the side of the specimen where the primary beam is incident, after which they travel back, against the direction of incidence of the primary electrons, approximately along the field lines of the focusing lens. Therefore, when a detector (for example, provided with an electrode carrying a positive voltage of 300 V) is arranged in the vicinity of the secondary electrons thus travelling back, the secondary electrons are captured by this electrode and the detector outputs an electric signal which is proportional to the electric current thus detected. The (secondary electron) image of the specimen is thus formed in known manner. With a view to the quality of the image, notably the speed at which the image is formed and the signal-to-noise ratio, the detected current is preferably as large as possible.

According to the cited United States patent the specimen to be examined is arranged in an atmosphere of a gas at a pressure of between 0.05 Torr ($\approx 6.5$ N/m$^2$) and 20 Torr ($\approx 2630$ N/m$^2$), so a pressure which is many times higher than the pressure at which conventional SEMs operate. The electric field produced by the voltage between the specimen and the electrode of the detector accelerates the secondary electrons emanating from the specimen to such a speed that they are capable of ionizing the atoms of the gas enveloping the specimen. During these ionizations, one or more electrons are released from the gas atoms, which electrons themselves are accelerated and can release further electrons by further ionizations again, etc. The gas surrounding the specimen thus acts as an amplifier for the secondary electron current, so that the current to be detected can in principle be larger than the current caused by the secondary electrons themselves.

Further advantages of a SEM operating with a gas atmosphere (to be referred to hereinafter as an "Environmental SEM" or ESEM) over the conventional SEM consist in that the ESEM enables the formation of electron optical images of humid or non-conductive specimens (for example, biological specimens, synthetic materials, ceramic materials or glass fibers) which are extremely difficult to image in the customary vacuum conditions in the conventional SEM. The ESEM enables the specimen to be maintained in its "natural" condition, without the specimen having to be subjected to the adverse effects of drying, freezing or vacuum coating operations which are normally required for the study by means of electron beams in high vacuum conditions.

Furthermore, because of the comparatively high permissible pressure in the specimen space of the ESEM, the gas ions formed neutralize any electric charging of a non-conductive specimen which could otherwise impede the formation of an image of high resolution. The ESEM also enables direct, real-time observation of phenomena such as transport of liquids, chemical reactions, solution, crystallization and other processes taking place at a comparatively high vapor pressure which is far beyond that permissible in the specimen space of a conventional SEM.

It is to be noted that, generally speaking, ESEMs can operate with an atmosphere in the specimen space whose pressure is also outside the range stated in the cited United States patent. It is notably possible to admit a lower pressure in the specimen space, for example a pressure of 0.01 Torr ($\approx 1.3$ N/m$^2$).

It is a drawback of the device disclosed in the cited United States patent that a comparatively high voltage is required at the detector electrode so as to obtain a sufficient number of successive ionizations, and that hence the distance between the specimen and the detector electrode cannot become smaller than a comparatively large minimum distance.

It is an object of the invention to provide a scanning particle-optical apparatus in which the number of collisions between the ionizing electrons and the gas atoms becomes substantially higher than in the known particle-optical apparatus while using the same geometry of the specimen and the detector electrode.

To this end, the particle-optical apparatus according to the invention is characterized in that it includes means for producing an additional magnetic field in the space between the detection means and the specimen holder. In the context of the present invention the space between the detection means and the specimen holder is to be understood to mean the space which is traversed by electrically charged particles originating from the specimen (and possibly particles produced by said particles, for example electrons and ions produced by ionizations) before they are captured by a detector electrode.

It is to be noted that in the context of the present invention an additional magnetic field is to be understood to mean a magnetic field which is formed additionally to the magnetic field formed in the focusing device which serves to produce a focus of the primary beam, which field may possibly extend as far as the specimen as in the case of an immersion lens.

As is known, an electron moving in a magnetic field experiences a force which is directed perpendicularly to the direction of movement and also perpendicularly to the magnetic field. In the absence of a magnetic field, a secondary electron travelling from the specimen to the detector electrode will follow a practically straight path to the detector electrode, except for changes of direction due to collisions with gas atoms. In the presence of a magnetic field, therefore, such an electron is deflected away from its direction of movement to the detector electrode and, theoretically speaking, in the case of given field geometries it cannot even reach the detector electrode in the absence of loss of energy. As a result, this electron will travel a substantially longer distance, so that the probability of collisions with the gas atoms is substantially increased. Because of the ionizing collisions with the gas atoms, such an electron loses each time a given amount of energy during its travel, so that ultimately it can be captured by the detector electrode after all. During this considerably longer travel, therefore, this electron will have experienced a proportionally larger number of ionizing collisions, and hence have released a larger number of electrons. The same also holds for the electrons released by such collisions. Thus, a cascade of released electrons is formed, thus ensuring that the signal to be detected is much greater than in the absence of an additional magnetic field. This signal to be detected may take various forms, all of which constitute a representation of the current of electrons released from the specimen.

In an embodiment of the invention the detection of the signal to be detected takes place in that the signals originating from the specimen in response to the incidence of the primary beam are formed by electrically charged particles originating from the specimen. This current of electrically charged particles from the specimen may be the current of secondary electrons (i.e. the total number of electrons released from the specimen and the electrons produced by multiplication in the gas discharge). Alternatively, the current of electrically charged particles originating from the specimen is formed by a current of ions which arises in the gas discharge, moves to the specimen under the influence of the electric field and can be measured as a specimen current. A third possibility consists in that the current of electrically charged particles originating from the specimen is formed by a current of ions which arises in the gas discharge and moves, under the influence of, for example, an electric field produced by the detection means, to an electrode of the detection means and can be measured as a detector current. It is alternatively possible to combine two or more of the currents thus formed and to detect the signal then arising.

It is to be noted that in the context of the present invention the phrase "the space between the detection means and the specimen holder" is to be understood to mean the space which is traversed by electrically charged particles originating from the specimen (and possibly particles caused by these particles, such as electrons and ions produced by ionization) before these particles are captured by a detector electrode.

In a further embodiment of the invention, the signal to be detected is detected in that the signals originating from the specimen in response to the incidence of the primary beam are formed by light signals which are generated by gas ionizations in the space between the detection means and the specimen holder. This effect is also amplified by the additional magnetic field, because it increases the path length of the electrons and hence the number of ionizations and also the amount of light generated thereby.

A preferred embodiment of the particle-optical apparatus according to the invention is provided with adjusting means for adjusting the strength of the additional magnetic field independently of the focusing device. This results in a high degree of flexibility of use of the apparatus, enabling the magnetic field to be adapted to a variety of imaging parameters which are subject to change, for example the distance between the specimen and the objective lens, the number of secondary electrons per primary electron, the acceleration voltage, the gas pressure in the specimen space, the number of ions required for discharging the specimen, etc.

The means for producing the additional magnetic field in a further preferred embodiment of the invention are arranged to produce a field shape which has practically no effect on the direction of the primary beam. Such a field shape can be readily realized by a person skilled in the art. Examples of such field shapes are a field shape which is rotationally symmetrical about the optical axis, a field shape having an n-tuple symmetry around the optical axis, as in the case of multipole fields extending perpendicularly to the axis, or a field shape with mirror symmetry in a plane through the axis. These field shapes offer the advantage that the primary beam is practically not disturbed by the additional magnetic field. Should such a field cause some disturbance nevertheless, it could be readily compensated by readjustment of the (rotationally symmetrical) field of the objective lens.

The focusing device in another embodiment of the invention, is formed by a magnetic slit lens and the means for producing the additional magnetic field are formed by a coil which is situated around the optical axis and on the outer side of the pole piece at the side of the lens which faces the specimen.

This embodiment offers the advantage that the field thus formed is automatically rotationally symmetrical about the optical axis. Any disturbances of the primary beam by the additional magnetic field can then be readily compensated by readjustment of the excitation of the likewise rotationally symmetrical slit lens.

The focusing device in a further embodiment of the invention is formed by a magnetic monopole lens with a pole piece which extends as a funnel around the optical axis and whose end of smaller diameter faces the specimen holder, the means for producing the additional magnetic field being formed by a coil which is arranged around the outer side of the funnel-shaped pole piece. This embodiment offers the advantage that the iron of the monopole lens is used to form the additional magnetic field, so that no or hardly any additional iron is required to form the field and the field thus formed is automatically rotationally symmetrically situated about the optical axis. Furthermore, the coil for generating this field then occupies only a comparatively small useful space in the specimen chamber.

The coil arranged around the outer side of the funnel-shaped pole piece in another embodiment of the invention is situated at the area of the end of smaller diameter thereof. In this manner the additional field is generated at the area where it is required most, i.e. in the vicinity of the space between the specimen and the lower side of the objective.

The means for producing the additional magnetic field in another embodiment yet of the invention are situated below the specimen holder, viewed from the electron beam. This embodiment is attractive notably when rotation symmetry of this field is necessary but the space in the vicinity of the monopole lens is required for other purposes, as in the case of large semiconductor wafers which must be tilted relative to the monopole lens for inspection.

The focusing device in another embodiment of the invention is provided with a magnetic circuit and the means for producing the additional magnetic field are formed by a magnetic circuit which is provided with a coil and is separate from the magnetic circuit of the focusing device. This embodiment can be advantageously used in situations in which the magnetic circuit may not be disturbed by other fields, or in which the manipulation of the additional magnetic field should be independent of the objective field for other reasons.

The magnetic circuit for the additional field in another embodiment of the invention has an E-shaped cross-section. Field concentrations can thus be readily generated in the vicinity of the central projection of the magnetic circuit so that, for example one or more electrodes for the detection of secondary electrons can be arranged at that area.

The detection means in a further embodiment of the invention include two grids which are arranged in the additional field and can be adjusted to a different electric potential. Secondary electrons can thus be pulled from the area of the specimen in the direction of the two electrodes by an electric field, the desired amplification of the detector current taken place at said electrodes because of the presence of the additional magnetic field. The additional magnetic field may again be attractively configured so as to be rotationally symmetrical about the optical axis.

The detection means in another embodiment yet of the invention are arranged to produce an electric multipole field around the optical axis which extends transversely of the optical axis in the same space as the additional magnetic field. This embodiment offers the advantage that a comparatively strong detector field can be realized while the primary electron beam is only slightly influenced. Moreover, the space angle at which the specimen is perceived from the electrode assembly producing the electric multipole field is thus made very large.

The detection means in a further embodiment of the invention are also arranged to produce a magnetic multipole field around the optical axis which extends transversely of the optical axis in the same space as the electric multipole field, said magnetic multipole field constituting the additional magnetic field. This embodiment avoids the necessity of separate means for generating the additional magnetic field.

The invention will be described in detail hereinafter with reference to the Figures in which corresponding reference numerals denote corresponding elements. Therein:

Figure 1:
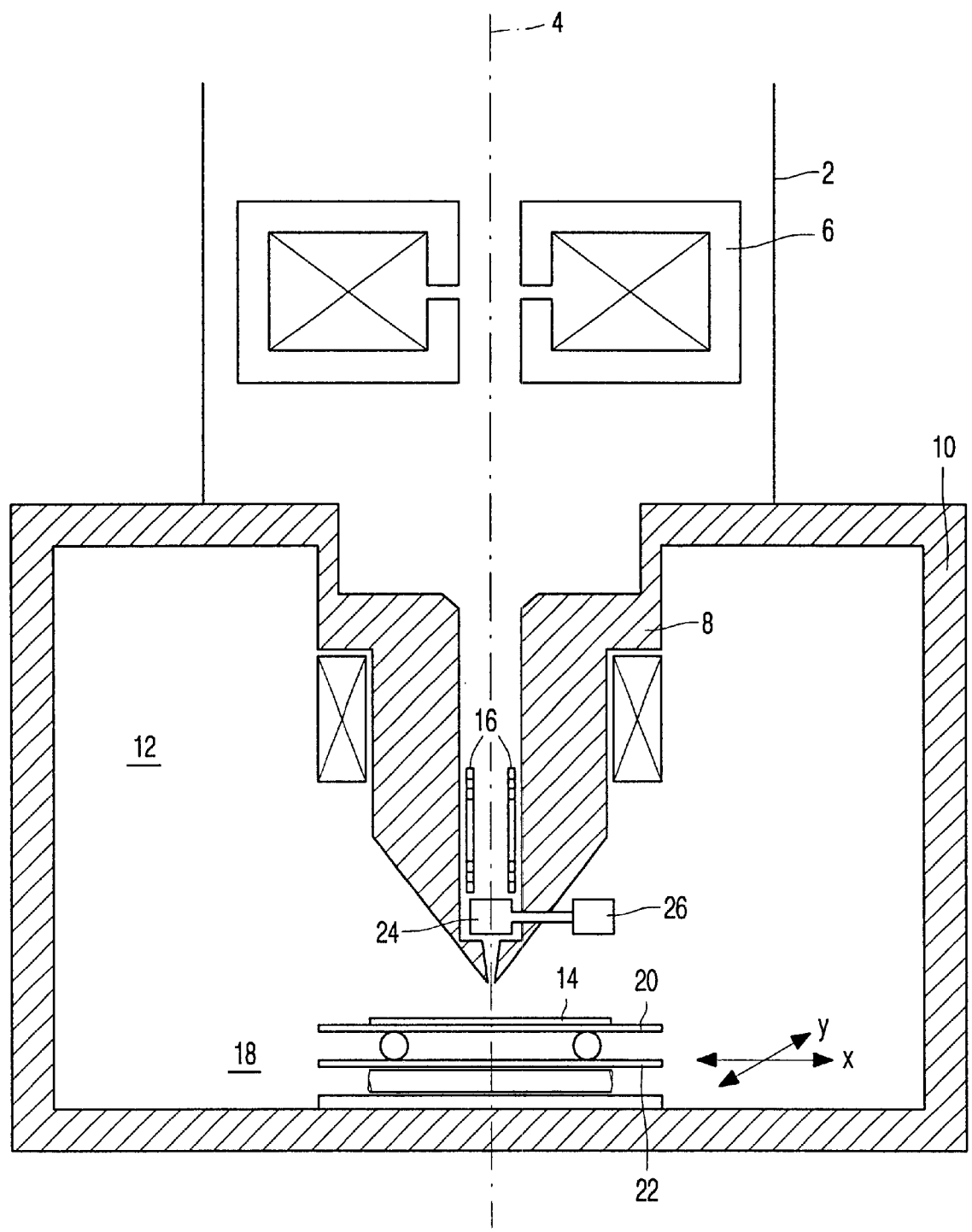
FIG. 1 is a diagrammatic representation of a particle-optical instrument in which the invention can be used.

FIG. 1 shows a particle-optical instrument in the form of a part of a column 2 of a scanning electron microscope (SEM). As is customary, an electron source (not shown in the Figure) in this instrument produces a beam of electrons which travels along the optical axis 4 of the instrument. This electron beam can pass through one or more electromagnetic lenses, such as the condensor lens 6, after which it reaches the lens 8. This lens, being a so-called monopole lens, forms part of a magnetic circuit which is furthermore formed by the wall 10 of the specimen chamber 12. The lens 8, however, may also be constructed as a conventional slit lens, in which case the magnetic circuit is situated completely within the lens and hence the wall 10 of the specimen chamber 12 does not form part of the magnetic circuit. The lens 8 is used to form an electron beam focus whereby the specimen 14 is scanned. Such scanning takes place by moving the electron beam across the specimen in the x direction as well as in the y direction by means of scan coils 16 provided in the lens 8. The specimen 14 is arranged on a specimen table 18 which includes a carrier 20 for the x displacement and a carrier 22 for the y displacement. A desirable region of the specimen can be selected for examination by means of these two carriers. Secondary electrons which travel back in the direction of the lens 8 are released from the specimen. These secondary electrons are detected by a detector 24 which is provided in the bore of this lens. A control unit 26 is connected to the detector in order to activate the detector and to convert the current of detected electrons into a signal which can be used to form an image of the specimen, for example by means of a cathode ray tube. Even though the detector is arranged in the bore of the monopole lens 8 in this Figure, it is alternatively possible to arrange the detector in the space between the specimen 14 and the monopole lens 8 and to construct it, for example as a flat plate as denoted by the reference numeral 30 in the following Figures. The latter arrangement offers advantages notably in the case of ESEMs, because the electrons multiplying in the gas atmosphere can then be captured with a higher efficiency by the plate-shaped detector.

Figure 2:
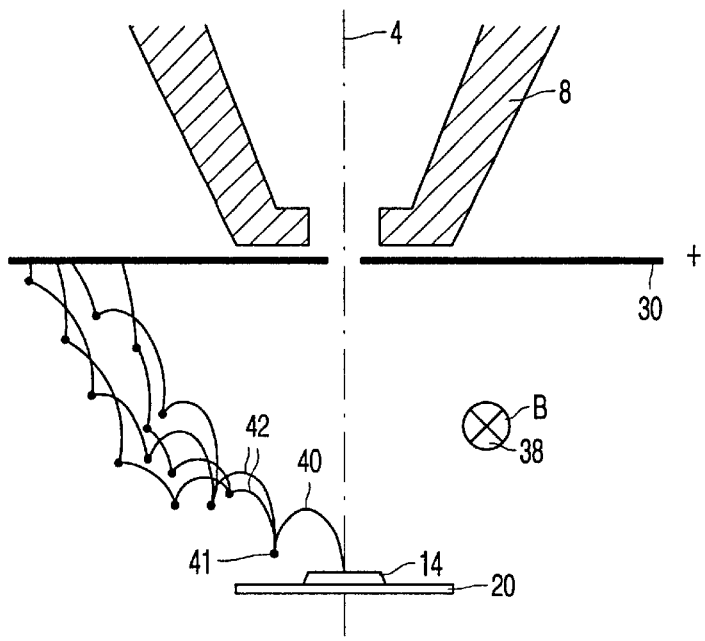
FIG. 2 illustrates diagrammatically the process of electron multiplication by means of an additional magnetic field.

FIG. 2 shows diagrammatically the process of electron multiplication by means of an additional magnetic field in a gas atmosphere. The primary electron beam, focused by a preceding objective lens 8, is incident on a specimen 14 on a specimen holder 20 along the optical axis 4 of the apparatus (not shown in the Figure). Underneath the objective lens 8 there is arranged a plate-shaped detector electrode 30 which is provided with an opening at its center for the passage of the primary beam. The detector electrode 30 carries a positive voltage, so that the secondary electrons released in the specimen are accelerated in the direction of this electrode. For the simplicity of the illustration, in FIG. 2 an additional magnetic field B is assumed to extend perpendicularly to the plane of drawing, as denoted by the symbol 38. A secondary electron 14, emanating from the specimen 14, is accelerated in the direction of the electrode 30 by the electric field produced by the combination of the positive electrode 30 and the grounded specimen 14. Because of the speed of the electron, it is deflected by the magnetic field B so as to follow a cycloid path 40. If it were not to loose any energy while travelling the presence of the field B would prevent the electron from ever reaching the electrode 30. The voltage at the electrode 30 is sufficiently high (for example, 300 V) to ensure that, while following this path, the electron can take up sufficient energy to ionize a gas atom 41 present in the specimen space, with the result that at least one additional free electron is formed. The ionizing electron as well as the additional electron are again accelerated in a cycloid path 42 by the electric field, after which the described process can repeat itself. The ionizing electron has lost a given amount of energy during ionization, so that it starts to travel along a path which is situated nearer to the electrode 30. The described process is repeated for all electrons moving in the specimen space and continues for all electrons until the relevant electron reaches the electrode 30. For the sake of simplicity of the drawing, double the number of electrons is not shown for each ionizing collision. An avalanche-like discharge is thus achieved in the specimen space, the probability of collision of an electron with a gas atom being substantially increased by the presence of the additional magnetic field. The quantity of electrons released by ionizations is thus increased in proportion and hence also the current signal formed by the secondary electrons.

Figure 3:
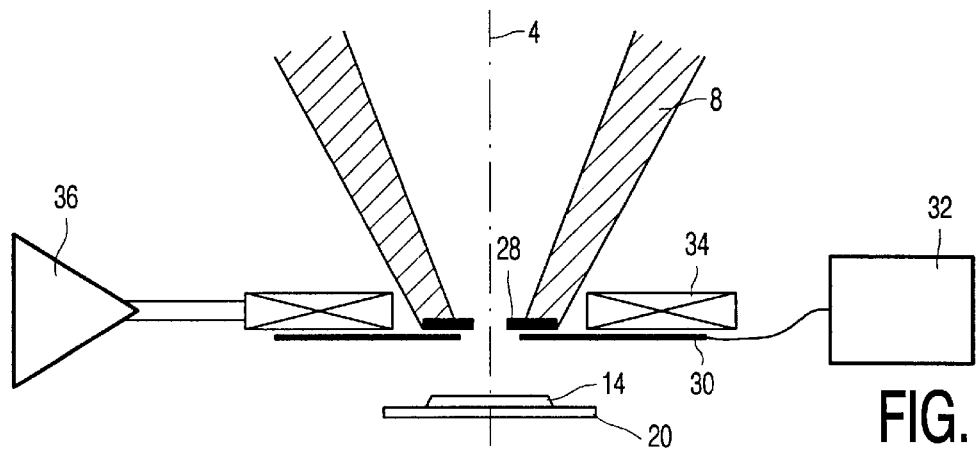
FIG. 3 is a diagrammatic representation of an embodiment of a specimen space with an electron lens and a coil for an additional magnetic field.

FIG. 3 shows a specimen space with an immersion lens and a coil for forming an additional magnetic field. The immersion lens in this Figure is represented by the funnel-shaped lower part of the magnet pole 8. Underneath the magnet pole 8 there is arranged a specimen holder 20 with a specimen 14. The magnet pole 8 forms part of the iron circuit 8, 10 as shown in FIG. 1, so that a magnetic field for focusing the beam travelling along the optical axis 4 is present between this magnet pole and the specimen.

The space within the funnel-shaped magnet pole 8 communicates with the other components of the electron optical column 2; as is known, for various reasons the pressure in this column must be substantially lower than said values (up to ≈2500 N/m²) of the pressure in the specimen space of the ESEM. In order to enable this pressure difference to be sustained, a separating diaphragm 28 is provided in known manner between the specimen space and the column 2. The diaphragm 28 has a bore of, for example 0.1 mm. The desired low pressure in the column can be sustained by providing a pumping opening (not shown) directly above this diaphragm.

Around the outer side of the funnel-shaped pole piece 8, at the area of the end of smaller diameter, there is provided a coil 34 for generating the additional magnetic field. This coil is fed by a controllable power supply source 36. Directly below the narrow end of the pole piece 8 there is arranged a plate-shaped detector electrode 30 for capturing the secondary electrons.

The secondary electrons released from the specimen in this embodiment are captured by the plate-shaped detector 30 which is maintained at a suitable voltage of, for example +300 V. The further processing of the current signal formed by these secondary electrons takes place in a power supply and processing unit 32. Such further processing of the current signal is not of essential importance to the invention, so that the unit 32 will not be described in detail.

Figure 4:
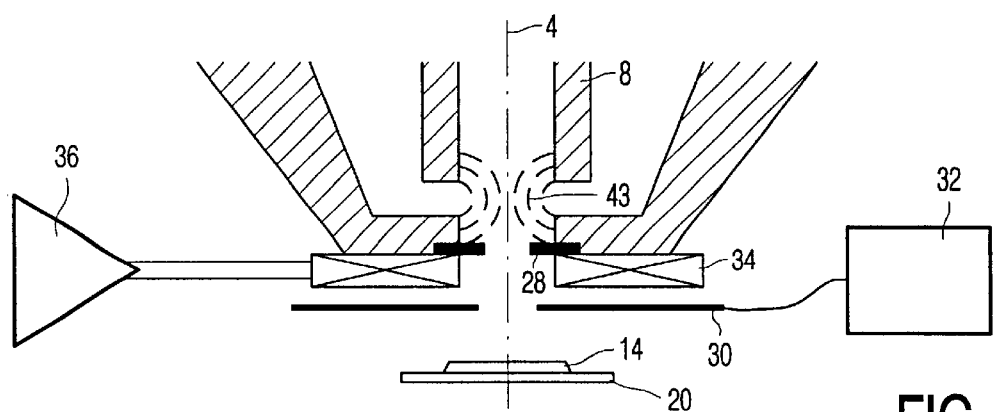
FIG. 4 is a diagrammatic representation of a further embodiment of a specimen space with an electron lens and a coil for an additional magnetic field.

FIG. 4 shows a specimen space with a slit lens and a coil for forming an additional magnetic field. Like in FIG. 3, a separating diaphragm is provided so as to enable the specimen space to be maintained at the desired comparatively high pressure. The magnetic field generated by the slit lens is now situated completely within the lens; this is diagrammatically denoted by the field lines 43. The additional magnetic field in this embodiment is generated by means of a coil 34 which is situated on the outer side of the pole piece 8, at the side of the slit lens which faces the specimen, so directly underneath the lens. The detector plate 30 is arranged directly underneath the coil 34. The process of amplification of the secondary electron current takes place in the same way as described with reference to the FIGS. 2 and 3.

Figure 5:
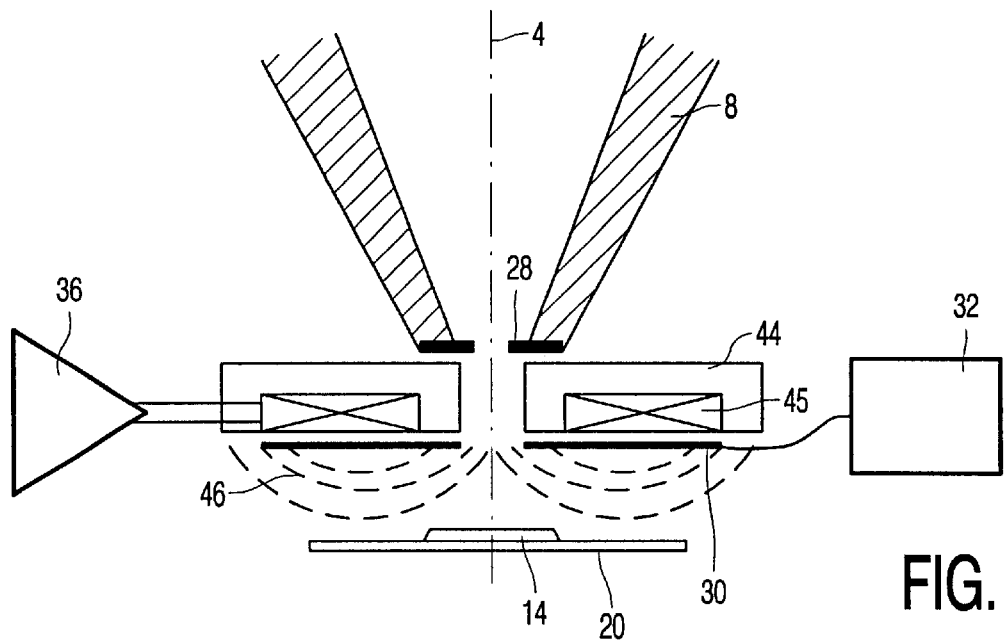
FIG. 5 is a diagrammatic representation of another embodiment yet of a specimen space with an electron lens and another embodiment of the means for producing an additional magnetic field.

FIG. 5 shows a specimen space with an immersion lens and means for producing the additional magnetic field. The means in this embodiment are formed by a magnetic circuit 44 which is provided with a coil 45 and is separate from the magnetic circuit of the focusing device formed by the immersion lens. The magnetic circuit 44 is made of a suitable material, for example iron, is rotationally symmetrically arranged around the optical axis 4 and has an E-shaped cross-section in a plane through this axis. At the center of the iron circuit there is provided a bore for the passage of the primary beam. The coil 45 is arranged in the rotationally symmetrical cavity defined by the E-shape. The magnetic field generated by this magnetic circuit is denoted by the field lines 46. These field lines extend from the central core of the E-shape to the outer edge as indicated in the Figure. The process of amplification of the secondary electron current takes place in the same way as described with reference to the FIGS. 2 and 3.

Figure 6:
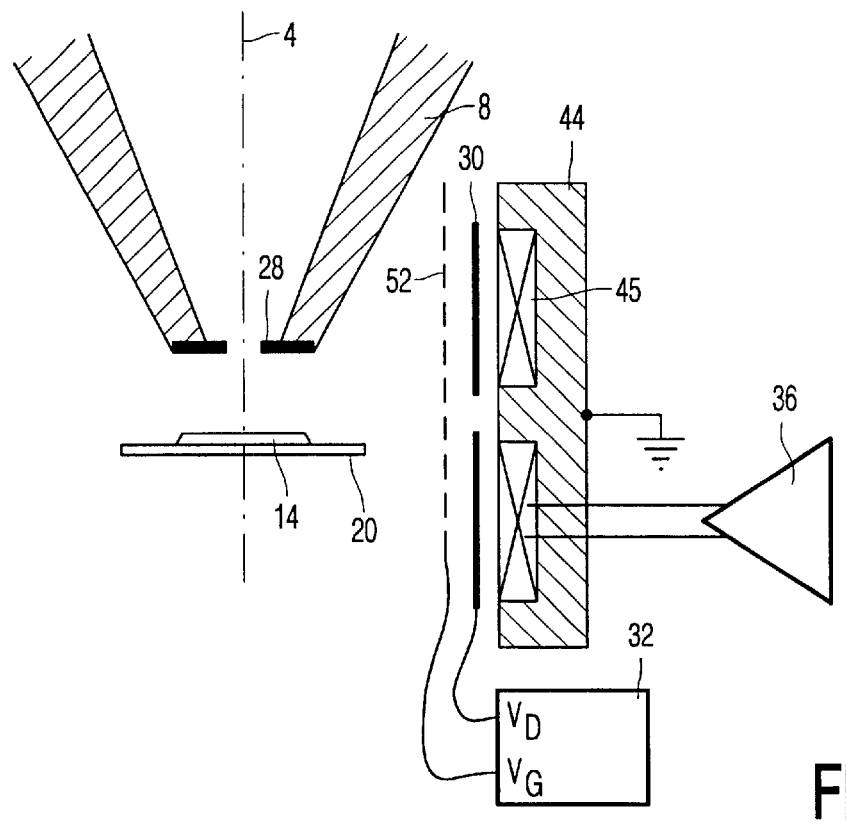
FIG. 6 shows an alternative version of FIG. 5 in which the means for producing an additional magnetic field and the electron detector are arranged adjacent the electron lens and the specimen.

FIG. 6 is an alternative version of FIG. 5. In the version shown in FIG. 6, the magnetic circuit 44 provided with a coil 45 is arranged adjacent the electron lens 8, like the detector electrodes 30 and 52 which are arranged in front of the magnetic circuit 44, 45, viewed from the optical axis 4. In FIG. 6 this circuit again has a rotationally symmetrical shape and an E-shaped cross-section in a plane through its symmetry axis. The coil 45 is arranged in the rotationally symmetrical cavity defined by the E-shape. The magnetic field generated by this magnetic circuit has the same shape as in FIG. 5. The voltage $V_D$ at the detector electrodes 30 and the voltage $V_G$ at the detector electrodes 52 are adjusted by means of the power supply and processing unit 32 in such a manner that the electric field caused by these electrodes has no or only a negligible effect on the imaging by the primary beam. To this end, the electrode 30 is adjusted, for example to a voltage of +300 V whereas the electrode 52 is adjusted to a low positive voltage of, for example +5 V and the iron circuit 44 has the same potential as the specimen (ground potential). Because of the low positive voltage of the electrode 52, the secondary electrons released from the specimen are pulled in the direction of this electrode, after which they are collected by the electrode 30. The comparatively strong electric field produced by the electrode 30 is practically completely shielded by the electrode 52. This embodiment is very suitable for use in cases in which, for example due to lack of space, no detection means and no magnet coil may be arranged in the space between the electron lens and the specimen.

Figure 7:
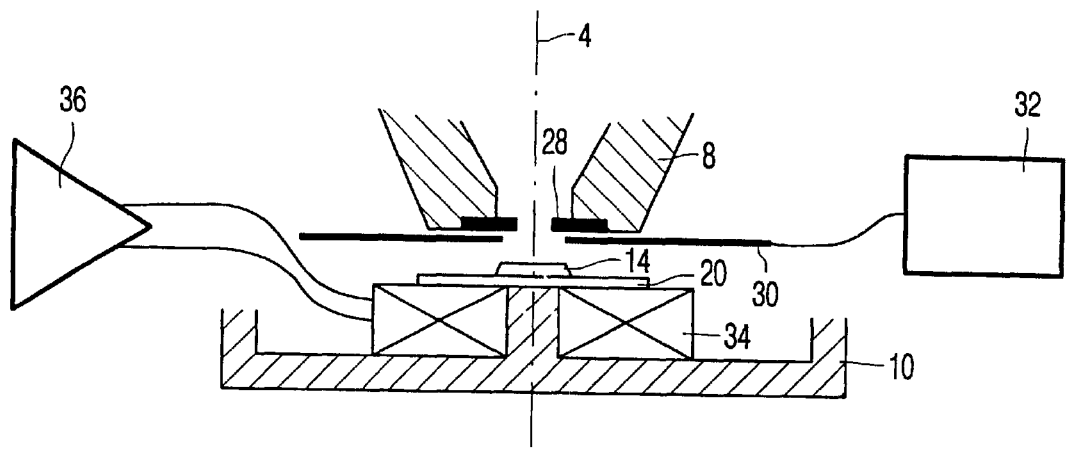
FIG. 7 is a diagrammatic representation of another embodiment yet of a specimen space with an electron lens and a coil for an additional magnetic field.

FIG. 7 shows a specimen space with an electron lens and means for producing the additional magnetic field. The means in this embodiment are formed by a coil 34 which is situated underneath the specimen holder, viewed from the electron beam. In this embodiment it is irrelevant whether the electron lens is an immersion lens or a slit lens. In the case of an immersion lens, the iron circuit 8, 10 may also serve as the iron circuit for generating the magnetic field. As a result of this arrangement of the coil 34 it is achieved that the space between the specimen holder 20 and the lower side of the lens is not occupied by a voluminous coil. This is particularly attractive if the space in the vicinity of the monopole lens is required for other purposes, as is the case for large semiconductor wafers which must be tiltable relative to the lens for inspection purposes; this motion may not be impeded by elements present in this space.

Figure 8:
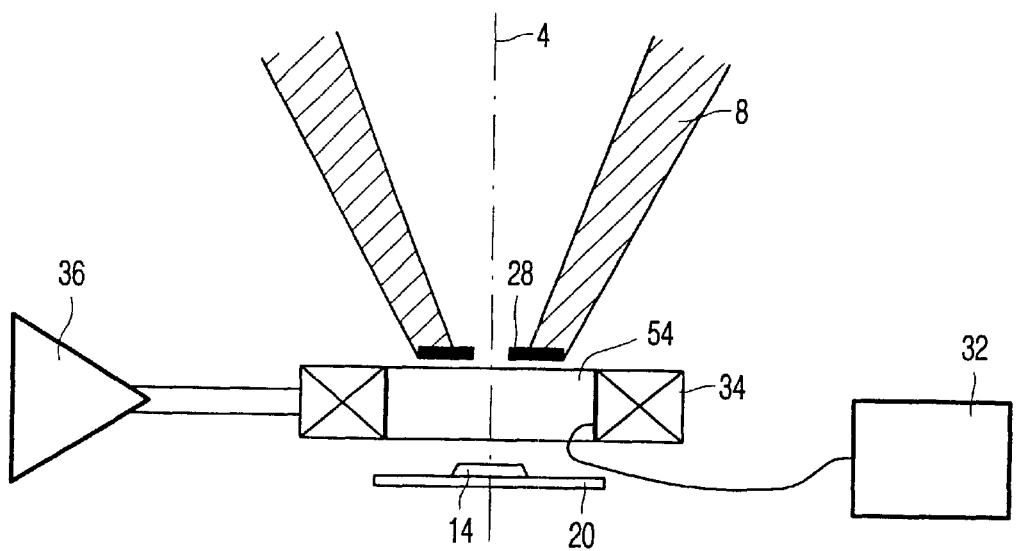
FIG. 8 is a diagrammatic representation of a further embodiment of a specimen space with a special embodiment of the secondary electron detector.

FIG. 8 shows an embodiment of the invention with a special embodiment of the secondary electron detector. This embodiment of the electron detector is constructed as an electric multipole which may be combined, if desired, with a magnetic multipole. The electric multipole 54 generates an electrostatic multipole field which extends perpendicularly to the optical axis 4. Such a field may generally be an n-pole field, where n=4, 6, 8 . . . Multipoles of this kind are generally known to those skilled in the art of electron microscopes. The additional magnetic field in this embodiment can be generated by means of a separate coil 34. However, it is also known to construct a multipole as a combination of electric and magnetic fields. The magnetic poleshoes in such a multipole unit are provided, for example, with pole caps which are electrically insulated therefrom and carry a voltage such that they produce the electric multipole field. The coil 34 can then be omitted and the additional magnetic field is formed by the magnetic multipole field. In this embodiment a comparatively strong electric and/or magnetic field is feasible, because use is made of the known property of a multipole field that the field axis may be comparatively weak at the optical whereas it may be very strong at a large distance from the axis. Thus, the primary beam is not or only hardly affected by these fields, strong fields nevertheless being possible for electron multiplication and detection. Moreover, this embodiment offers a detector having a comparatively large space angle for capturing the secondary electrons and with a discharge space within the multipole electrodes in which the electrons may be contained for a comparatively long period of time, enabling a high current amplification of the secondary electrons.

What is claimed is:

1. A particle-optical apparatus which includes
    a particle source for producing a primary beam of electrically charged particles which travel along an optical axis (4) of the apparatus,
    a specimen holder (20) for a specimen (14) to be irradiated by means of the apparatus,
    a focusing device (8) for forming a focus of the primary beam in the vicinity of the specimen holder,
    scanning means (16) for scanning the specimen (14) by means of the focused beam,
    detection means (30,32) for detecting signals originating from the specimen in response to the incidence of the primary beam, the detected signals at least partially existing in a gaseous environment, the particle-optical apparatus being provided with means (34) for producing a magnetic field (B), additional to the focusing device, in the space between the detection means (30,32) and the specimen holder, to lengthen the detected signals thereby resulting in higher degrees of ionization.

2. A particle-optical apparatus as claimed in claim 1, in which the signals originating from the specimen in response to the incidence of the primary beam are formed by electrically charged particles originating from the specimen (14).

3. A particle-optical apparatus as claimed in claim 2, in which the signals originating from the specimen in response to the incidence of the primary beam are formed by light signals which are generated by gas ionizations in the space between the detection means (30, 32) and the specimen holder.

4. A particle-optical apparatus as claimed in claim 2, in which the focusing device is provided with a magnetic circuit (8, 10) and the means for producing the additional magnetic field are formed by a magnetic circuit (44) which is provided with a coil (45) and is separate from the magnetic circuit of the focusing device.

5. A particle-optical apparatus as claimed in claim 4, in which the detection means include two grids which are arranged in the additional field and can be adjusted to a different electric potential.

6. A particle-optical apparatus as claimed in claim 4, in which the magnetic circuit forth additional field has an E-shaped cross-section.

7. A particle-optical apparatus as claimed in claim 6, in which the detection means include two grids which are arranged in the additional field and can be adjusted to a different electric potential.

8. A particle-optical apparatus as claimed in claim 6, in which the magnetic circuit for the additional field is arranged in such a manner that the additional magnetic field has a rotationally symmetrical shape around the optical axis.

9. A particle-optical apparatus as claimed in claim 1, provided with adjusting means (36) for adjusting the strength of the additional magnetic field independently of the focusing device.

10. A particle-optical apparatus as claimed in one of the claims, 1–9, in which the means for producing the additional magnetic field are arranged to produce a field shape (46) which has practically no effect on the direction of the primary beam.

11. A particle-optical apparatus as claimed in claims 10, in which the focusing device is formed by a magnetic slit lens and the means for producing the additional magnetic field are formed by a coil (34) which is situated around the optical axis and on the outer side of the pole piece at the side of the lens which faces the specimen.

12. A particle-optical apparatus as claimed in claim 10, in which the focusing device is formed by a magnetic monopole lens with a pole piece which extends as a funnel around the optical axis and whose end of smaller diameter faces the specimen holder, the means for producing the additional magnetic field being formed by a coil (34) which is arranged around the outer side of the funnel-shaped pole piece.

13. A particle-optical apparatus as claimed in claim 12, in which the coil arranged around the outer side of the funnel-shaped pole piece is situated at the area of the end of smaller diameter thereof.

14. A particle-optical apparatus as claimed in one of the claims 1 to 3, in which the means for producing the additional magnetic field (34) are situated below the specimen holder, viewed from the electron beam.

15. A particle-optical apparatus as claimed in claim 1, in which the focusing device is provided with a magnetic circuit (8, 10) and the means for producing the additional magnetic field are formed by a magnetic circuit (44) which is provided with a coil (45) and is separate from the magnetic circuit of the focusing device.

16. A particle-optical apparatus as claimed in claim 15, in which the magnetic circuit for the additional field has an E-shaped cross-section.

17. A particle-optical apparatus as claimed in claim 16, in which the magnetic circuit for the additional field is arranged in such a manner that the additional magnetic field has a rotationally symmetrical shape around the optical axis.

18. A particle-optical apparatus as claimed in claim 16, in which the detection means include two grids which are arranged in the additional field and can be adjusted to a different electric potential.

19. A particle-optical apparatus as claimed in claim 15, in which the detection means include two grids which are arranged in the additional field and can be adjusted to a different electric potential.

20. A particle-optical apparatus as claimed in claim 1, in which the detection means (54) are arranged to produce an electric multipole field around the optical axis which extends transversely of the optical axis in the same space as the additional magnetic field.

21. A particle-optical apparatus as claimed in claim 20, in which the detection means (54) are also arranged to produce a magnetic multipole field around the optical axis which extends transversely of the optical axis in the same space as the electric multipole field, said magnetic multipole field constituting the additional magnetic field.

22. A particle-optical apparatus which includes a particle source for producing a primary beam of electrically charged particles which travel along an optical axis (4) of the apparatus, a specimen holder (20) for a specimen (14) to be irradiated by means of the apparatus, a focusing device (8) for forming a focus of the primary beam in the vicinity of the specimen holder, scanning means (16) for scanning the specimen (14) by means of the focused beam, detection means (30,32) for detecting signals originating from the specimen in response to the incidence of the primary beam, characterized in that the particle-optical apparatus is provided with means (34) for producing an additional magnetic field (B) in the space between the detection means (30,32) and the specimen holder, wherein the signals originating from the specimen in response to the incidence of the primary beam are formed by electrically charged particles originating from the specimen, creating light signals which are generated by gas ionizations in the space between the detection means (30, 32) and the specimen holder.

23. A particle-optical apparatus which includes a particle source for producing a primary beam of electrically charged particles which travel along an optical axis (4) of the apparatus, a specimen holder (20) for a specimen (14) to be irradiated by means of the apparatus, a focusing device (8) for forming a focus of the primary beam in the vicinity of the specimen holder, scanning means (16) for scanning the specimen (14) by means of the focused beam, detection means (30,32) for detecting signals originating from the specimen in response to the incidence of the primary beam, characterized in that the particle-optical apparatus is provided with means (34) for producing an additional magnetic field (B) in the space between the detection means (30,32) and the specimen holder, wherein the detection means are arranged to produce an electric multipole field around the optical axis which extends transversely of the optical axis in the same space as the additional magnetic field.

24. A particle-optical apparatus as claimed in claim 23, in which the detection means are also arranged to produce a magnetic multipole field around the optical axis which extends transversely of the optical axis in the same space as the electric multipole field, said multipole field constituting the additional magnetic field.

25. A particle-optical apparatus for viewing a specimen in a gaseous environment, comprising:

a particle source for providing a primary particle beam;

a specimen holder for holding a specimen to be scanned by said primary beam, wherein a secondary beam is generated from said specimen in response to the specimen receiving the primary beam, the secondary beam being generated in the gaseous environment;

a first magnetic field source for generating a first magnetic field to focus the primary beam onto the specimen;

a detector optically coupled to the specimen holder to receive the secondary beam; and a second magnetic field source to generate a second magnetic field, wherein the second magnetic field is at least partially between the specimen and detector to guide the secondary beam toward the detector in a path lengthening manner within the gaseous environment thereby amplifying the secondary beam.

26. The apparatus of claim 25, wherein the second magnetic field is a helical field that causes the secondary beam to take a helical path, within the gaseous field, from the specimen to the detector.

* * * * *

UNITED STATES PATENT AND TRADEMARK OFFICE
CERTIFICATE OF CORRECTION

PATENT NO. : 6,365,896 B1
DATED : April 2, 2002
INVENTOR(S) : Karel D. van der Mast It is certified that error appears in the above-identified patent and that said Letters Patent is hereby corrected as shown below:

<u>Title page,</u>
Item [73], line 2, please delete "Eindhovem" and insert -- Eindhoven -- therefor.

<u>Column 10,</u>
Line 6, please delete "forth" and insert -- for the -- therefor.
Line 20, please delete "1-9" and insert -- 1-3, 9 -- therefor.

Signed and Sealed this

Eighth Day of October, 2002

*Attest:*

JAMES E. ROGAN
*Attesting Officer*   *Director of the United States Patent and Trademark Office*